United States Patent
Fukuda et al.

(10) Patent No.: US 9,783,717 B2
(45) Date of Patent: *Oct. 10, 2017

(54) ADDITION-CURABLE SILICONE RESIN COMPOSITION, ADDITION-CURABLE SILICONE RESIN CURED PRODUCT, AND SEALED OPTICAL SEMICONDUCTOR ELEMENT

(71) Applicant: SUMITOMO SEIKA CHEMICALS CO., LTD., Kako-gun, Hyogo (JP)

(72) Inventors: Noriaki Fukuda, Hyogo (JP); Shohei Sanada, Hyogo (JP); Katsumasa Yamamoto, Hyogo (JP)

(73) Assignee: Sumitomo Seika Chemicals Co., Ltd., Hyogo (JP)

( * ) Notice: Subject to any disclaimer, the term of this patent is extended or adjusted under 35 U.S.C. 154(b) by 32 days.

This patent is subject to a terminal disclaimer.

(21) Appl. No.: 14/911,412

(22) PCT Filed: Jun. 27, 2014

(86) PCT No.: PCT/JP2014/067211
§ 371 (c)(1),
(2) Date: Feb. 10, 2016

(87) PCT Pub. No.: WO2015/025617
PCT Pub. Date: Feb. 26, 2015

(65) Prior Publication Data
US 2016/0194537 A1    Jul. 7, 2016

(30) Foreign Application Priority Data

Aug. 19, 2013 (JP) ................................ 2013-169804
Dec. 6, 2013 (JP) ................................ 2013-253169

(51) Int. Cl.
| | | |
|---|---|---|
| C08G 77/26 | (2006.01) | |
| C09K 3/10 | (2006.01) | |
| C08G 77/388 | (2006.01) | |
| H01L 33/56 | (2010.01) | |
| C08L 83/04 | (2006.01) | |
| C09D 183/08 | (2006.01) | |
| C09J 183/08 | (2006.01) | |
| C08L 83/08 | (2006.01) | |
| C08G 77/12 | (2006.01) | |
| C08G 77/20 | (2006.01) | |

(52) U.S. Cl.
CPC ............ *C09K 3/1018* (2013.01); *C08G 77/26* (2013.01); *C08G 77/388* (2013.01); *C08L 83/04* (2013.01); *C08L 83/08* (2013.01); *C09D 183/08* (2013.01); *C09J 183/08* (2013.01); *H01L 33/56* (2013.01); *C08G 77/12* (2013.01); *C08G 77/20* (2013.01); *C09K 2003/1059* (2013.01)

(58) Field of Classification Search
CPC ............ C08L 83/00; C08L 83/04; C08L 83/08
See application file for complete search history.

(56) References Cited

U.S. PATENT DOCUMENTS

| | | | |
|---|---|---|---|
| 4,489,200 A | 12/1984 | Dziark | |
| 5,175,057 A | 12/1992 | Wengrovius et al. | |
| 5,712,391 A | 1/1998 | Ohno et al. | |
| 6,379,751 B1* | 4/2002 | Schafer | C08G 18/12 427/389 |
| 7,297,745 B2 | 11/2007 | Amidaiji | |
| 7,799,434 B2 | 9/2010 | Webster | |
| 7,989,074 B2* | 8/2011 | Webster | C08G 18/4063 428/423.1 |
| 9,181,400 B2* | 11/2015 | Fukuda | H01L 23/296 |
| 2006/0120011 A1* | 6/2006 | Handa | H01L 21/67109 361/234 |
| 2006/0122323 A1 | 6/2006 | Dumont et al. | |
| 2007/0066730 A1* | 3/2007 | Chorvath | C08G 77/60 524/261 |
| 2009/0258058 A1 | 10/2009 | Thomas et al. | |
| 2011/0227235 A1 | 9/2011 | Yoshitake et al. | |
| 2011/0248314 A1 | 10/2011 | Takei et al. | |

(Continued)

FOREIGN PATENT DOCUMENTS

| | | |
|---|---|---|
| CN | 1382183 | 11/2002 |
| CN | 1671916 | 9/2005 |
| CN | 101478973 | 7/2009 |
| CN | 101885851 | 11/2010 |
| CN | 102131874 | 7/2011 |
| CN | 102190890 | 9/2011 |
| CN | 102234431 | 11/2011 |
| CN | 102246297 | 11/2011 |
| CN | 102627859 | 8/2012 |

(Continued)

OTHER PUBLICATIONS

International Search Report issued in PCT/JP2014/067211 dated Jul. 22, 2014.

*Primary Examiner* — Margaret Moore
(74) *Attorney, Agent, or Firm* — Hamre, Schumann, Mueller & Larson, P.C.

(57) ABSTRACT

The invention aims to provide an addition curable silicone resin composition with excellent interfacial adhesion properties, storage stability and transparency. The addition curable silicone resin mixtures has a refractive index of 1.35 to 1.45 and includes a silicone compound having at least one group of the following formula:

$$-R^{2a}+N-R^{2b}\}_{x}-NH \begin{array}{c} O \\ \diagdown \\ C-O-R^{3}-CH \diagdown^{OH}_{R^4} \\ \diagup \\ C-O \diagdown_{R^{3}-CH} \diagdown^{OH}_{R^4} \\ O \end{array} \quad (2)$$

7 Claims, 1 Drawing Sheet

(56) References Cited

U.S. PATENT DOCUMENTS

| | | |
|---|---|---|
| 2014/0256539 A1 | 9/2014 | Takei et al. |
| 2015/0284515 A1 | 10/2015 | Fukuda et al. |

FOREIGN PATENT DOCUMENTS

| | | |
|---|---|---|
| EP | 0 520 717 | 12/1992 |
| EP | 0 751 170 | 1/1997 |
| EP | 2 918 638 | 9/2015 |
| JP | 5-194857 | 8/1993 |
| JP | 9-012889 | 1/1997 |
| JP | 9-118827 | 5/1997 |
| JP | 10-182827 | 7/1998 |
| JP | 2001-040286 | 2/2001 |
| JP | 2001-131287 | 5/2001 |
| JP | 2004-359752 | 12/2004 |
| JP | 2005-158762 | 6/2005 |
| JP | 2005-158764 | 6/2005 |
| JP | 2006-137797 A | 6/2006 |
| JP | 2009-173789 A | 8/2009 |
| JP | 2010-84118 A | 4/2010 |
| JP | 2011-012144 | 1/2011 |
| JP | 2011-178983 A | 9/2011 |
| JP | 2011-246693 A | 12/2011 |
| JP | 2011-251936 | 12/2011 |
| JP | 2012-12434 A | 1/2012 |
| JP | 2012-041428 | 3/2012 |
| JP | 2012-149131 A | 8/2012 |
| JP | 2012-219113 | 11/2012 |
| JP | 5548322 B1 | 5/2014 |
| WO | 01/32766 | 5/2001 |
| WO | 2012/108609 A1 | 8/2012 |
| WO | 2014/073341 A1 | 5/2014 |

\* cited by examiner

ADDITION-CURABLE SILICONE RESIN COMPOSITION, ADDITION-CURABLE SILICONE RESIN CURED PRODUCT, AND SEALED OPTICAL SEMICONDUCTOR ELEMENT

TECHNICAL FIELD

The present invention relates to an addition-curable silicone resin composition with excellent interfacial adhesion properties, storage stability, and transparency. The present invention also relates to an addition-curable silicone resin cured product formed from the addition-curable silicone resin composition and a sealed optical semiconductor element formed by using the addition-curable silicone resin composition.

BACKGROUND ART

Transparent resins are generally used as materials for sealing light-emitting devices in LEDs or optical semiconductor devices. Epoxy resins or addition-curable, condensation-curable, or UV-curable silicone resins are used as such transparent resins. In particular, addition-curable silicone resins do not generate any by-products in hydrosilylation reactions of vinylsilyl groups with hydrosilyl groups, and provide cured products with excellent weather resistance, heat resistance, and other characteristics. Therefore, such addition-curable silicone resins are used for sealing high-brightness and high-power optical semiconductor devices such as white LEDs. However, addition-curable silicone resins are poorly adhesive to components of semiconductor materials. For example, in recent years, PCT (poly(1,4-cyclohexyldimethylene terephthalate)) with excellent weather resistance and moisture resistance has been employed as a reflecting material, instead of PPA (polyphthalamide resin), which has a problem of long-term stability such as weather resistance or moisture resistance. However, since PCT has no hydrogen-bonding donors in a molecule, silicone resins are poorly adhesive to PCT. Furthermore, silicone resins insufficiently adhere to noble metals such as silver, which are widely used as electrodes.

In addition, there has been another problem that adhesion is reduced due to heat from light-emitting devices or a temperature cycle, which is likely to cause separation of a silicone resin from a base material such as PCT or a noble metal electrode.

In order to solve these problems, adhesion has been improved by adding an adhesion-imparting agent such as a silane coupling agent, but sufficient effects has not been obtained. Furthermore, there remains a problem of poor durability. For example, significant moisture absorption causes a decrease in adhesion.

For example, Patent Literature 1 discloses an addition-curable silicone resin composition including an epoxy group-containing isocyanuric acid ester as an adhesion-imparting agent, and Patent Literature 2 discloses, as an adhesive silicone resin, a reactive modified silicone resin that contains a vinyl group and a carbamate group in one molecule and contains an alkoxy group or OH group bonded to a silicon atom, at an end of a molecular fragment.

CITATION LIST

Patent Literature

Patent Literature 1: JP 2006-137797 A
Patent Literature 2: WO 2012/108609

SUMMARY OF INVENTION

Technical Problem

However, a process for blending an isocyanuric acid ester as disclosed in Patent Literature 1 has not sufficiently improved adhesion to base materials. Further, an isocyanuric acid ester, which is hardly compatible with silicone resins, may not provide sufficient transparency. Furthermore, since a modified silicone resin as disclosed in Patent Literature 2 contains a vinyl group which imparts curability and a carbamate group which imparts adhesion in one and the same molecule, carbamate groups are uniformly dispersed throughout the entire cured resin. As a result, the concentration of the carbamate groups at and around the adhesive interface decreases, and sufficient effects of improving adhesion are sometimes not obtained. Further, if the amount of carbamate groups in a molecule is allowed to increase in order to increase the concentration of the carbamate groups at and around the adhesive interface, the carbamate groups may adversely affect the physical properties or durability of the silicone resin.

The use of silicone resins containing an alkoxy group or OH group, which is bonded to a silicon atom, may be employed as another way to improve adhesion, but such resins have a problem of poor storage stability.

The present invention aims to provide an addition-curable silicone resin composition with excellent interfacial adhesion properties, storage stability, and transparency. The present invention also aims to provide an addition-curable silicone resin cured product formed from the addition-curable silicone resin composition and a sealed optical semiconductor element formed by using the addition-curable silicone resin composition.

Solution to Problem

One aspect of the present invention relates to an addition-curable silicone resin composition including:
an addition-curable silicone resin mixture; and
an adhesion-imparting agent,
the addition-curable silicone resin mixture having a refractive index of 1.35 to 1.45, the adhesion-imparting agent including a compound that includes a structural unit represented by the formula (1-3) and/or a structural unit represented by the formula (1-4) between a structural unit represented by the formula (1-1) and a structural unit represented by the formula (1-2), the compound having a refractive index of 1.35 to 1.45:

(1-4)

wherein $R^{1a}$'s in the formulas (1-1) and (1-2) each independently represent a C1-C18 alkyl group, a cycloalkyl group, an aryl group, or an aralkyl group; $R^{1b}$'s in the formulas (1-3) and (1-4) each independently represent a C1-C18 alkyl group, a cycloalkyl group, an aryl group, or an aralkyl group; m in the formula (1-3) is an integer of 1 to 50; n in the formula (1-4) is an integer of 1 to 1500; and A's in the formulas (1-1) to (1-3) each independently represent a C1-C18 alkyl group, a cycloalkyl group, an aryl group, an aralkyl group, or a group represented by the formula (2), provided that at least one of A's in the formulas (1-1) to (1-3) is a group represented by the formula (2):

(2)

wherein $R^{2a}$ represents a C1-C8 alkylene group in which a carbon atom other than a carbon atom bonded to a silicon atom is optionally partially substituted with an oxygen atom; $R^{2b}$'s each independently represent a C1-C3 alkylene group; $R_3$'s each independently represent a C1-C3 alkylene group; $R^4$'s each independently represent a hydrogen atom, a C1-C3 alkyl group, an OH group-containing C1-C3 alkyl group, or a halogeno group; and x is an integer of 0 to 2.

The present invention is described in detail below.

The present inventors found that an addition-curable silicone resin composition with excellent interfacial adhesion properties, storage stability, and transparency can be obtained by blending an addition-curable silicone resin mixture with a compound having a specific structure as an adhesion-imparting agent, and adjusting the refractive indexes of the addition-curable silicone resin mixture and the adhesion-imparting agent. Thus, the present invention has been completed.

Figure 1A:
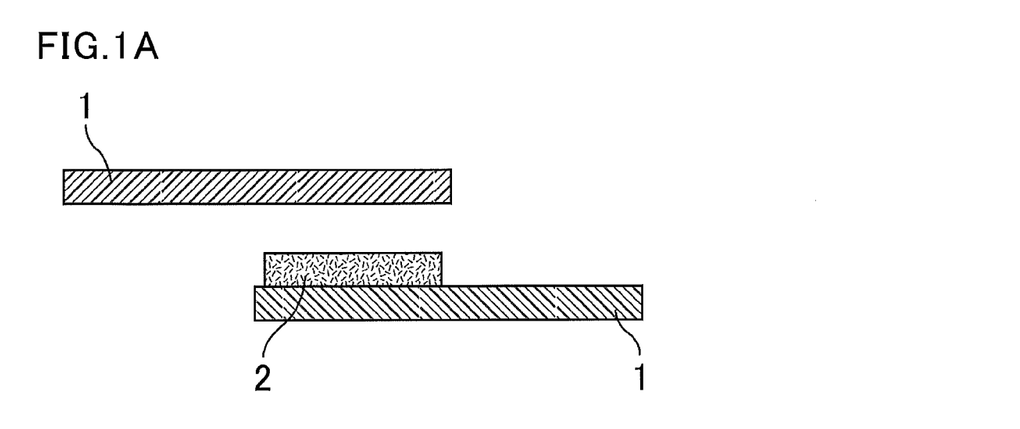
FIGS. 1A to 1C are schematic views showing failure patterns in cases where various addition-curable silicone resin compositions are used to bond adherends.
Figure 1B:
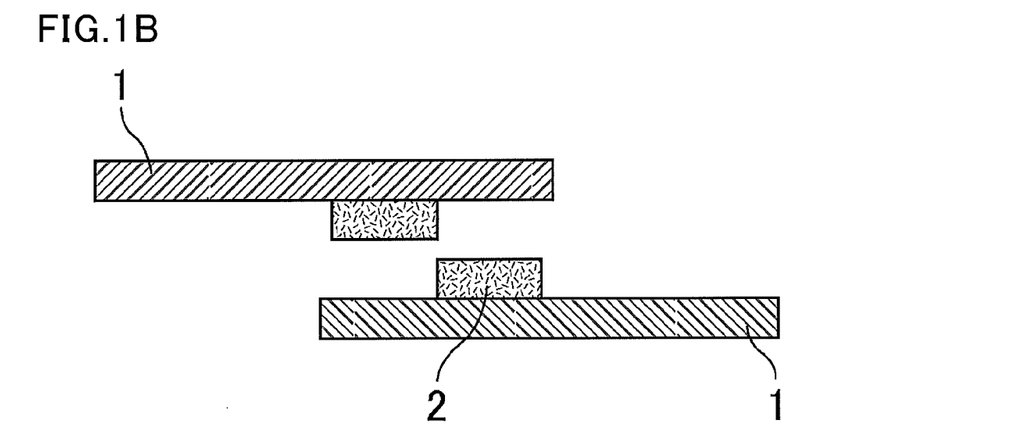
Figure 1C:
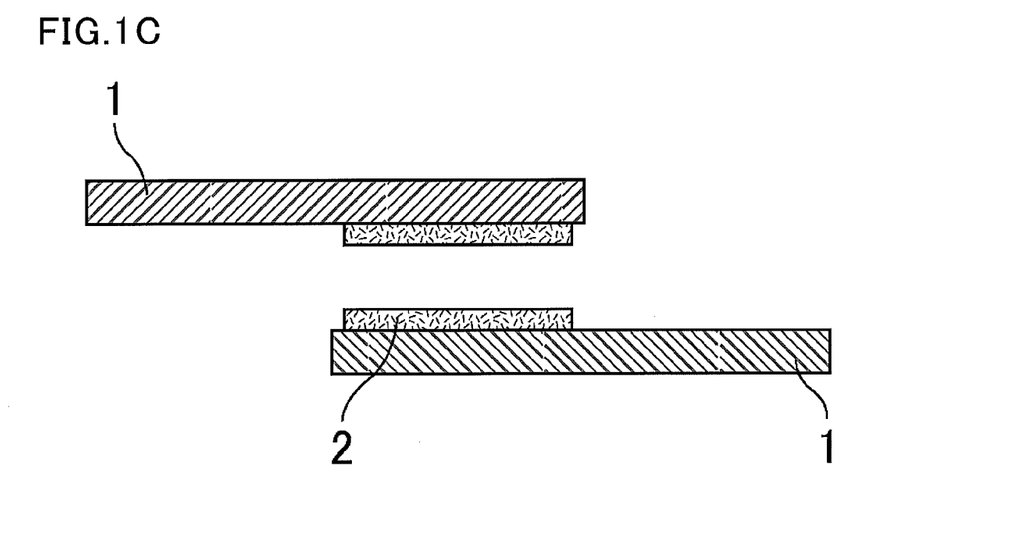

FIGS. 1A to 1C are schematic views showing failure patterns in cases where various addition-curable silicone resin compositions are used to bond adherends. FIGS. 1A and 1B show the case of using a conventional addition-curable silicone resin composition, and FIG. 1C shows the case of using the addition-curable silicone resin composition of the present invention.

As shown in FIGS. 1A and 1B, when adherends 1 are bonded with a conventional addition-curable silicone resin composition with poor interfacial adhesion to the adherends 1, interfacial failure occurs between the addition-curable silicone resin cured product 2 and each adherend 1. On the other hand, as shown in FIG. 1C, when the adherends 1 are bonded with the addition-curable silicone resin composition of the present invention with excellent interfacial adhesion properties, interfacial failure does not occur between the addition-curable silicone resin cured product 2 and each adherend 1, but cohesive failure of the addition-curable silicone resin cured product 2 occurs.

The addition-curable silicone resin composition of the present invention includes, as an adhesion-imparting agent, a compound having a structural unit represented by the formula (1-3) and/or a structural unit represented by the formula (1-4) between a structural unit represented by the formula (1-1) and a structural unit represented by the formula (1-2), the compound having a refractive index of 1.35 to 1.45 (hereinafter, also referred to as "the adhesion-imparting agent according to the present invention"). The structural units represented by the formulas (1-1) and (1-2) mean molecular ends. The adhesion-imparting agent according to the present invention may be a block copolymer or a random copolymer.

The adhesion-imparting agent according to the present invention is sufficiently effective even at a small amount. The reason is considered that the adhesion-imparting agent according to the present invention, which does not contain a curable functional group such as a vinyl group in a molecular structure, is gradually segregated to the adhesive interface between the addition-curable silicone resin composition and a base material during the curing reaction, and the concentration of the adhesion-imparting agent according to the present invention therefore increases at the adhesive interface. Furthermore, the adhesion-imparting agent according to the present invention, which does not contain an alkoxy group or OH group bonded to a silicon atom in a molecular structure, has excellent storage stability.

One adhesion-imparting agent according to the present invention may be used or two or more adhesion-imparting agents may be used in combination.

$R^{1a}$'s in the formulas (1-1) and (1-2) each independently represent a C1-C18 alkyl group, a cycloalkyl group, an aryl group, or an aralkyl group. The phrase "each independently represent" herein means "may be the same as or different from one another".

Examples of the C1-C18 alkyl group represented by $R^{1a}$ include methyl, ethyl, n-propyl, isopropyl, n-butyl, isobutyl, tert-butyl, n-pentyl, neopentyl, tert-pentyl, n-hexyl, n-heptyl, 2,2,4-trimethylpentyl, n-octyl, isooctyl, n-nonyl, n-decyl, and n-dodecyl. In particular, methyl is preferred.

Examples of the cycloalkyl group represented by $R^{1a}$ include cyclopentyl, cyclohexyl, cycloheptyl, and methylcyclohexyl.

Examples of the aryl group represented by $R^{1a}$ include phenyl, tolyl, xylyl, ethylphenyl, and naphthyl. In particular, phenyl is preferred.

Examples of the aralkyl group represented by $R^{1a}$ include benzyl, α-phenylethyl, and β-phenylethyl.

In particular, $R^{1a}$ is preferably a C1-C18 alkyl group or an aryl group, more preferably methyl or phenyl, still more preferably methyl.

$R^{1b}$'s in the formulas (1-3) and (1-4) each independently represent a C1-C18 alkyl group, a cycloalkyl group, an aryl group, or an aralkyl group.

Examples of the C1-C18 alkyl group represented by $R^{1b}$ include methyl, ethyl, n-propyl, isopropyl, n-butyl, isobutyl, tert-butyl, n-pentyl, neopentyl, tert-pentyl, n-hexyl, n-heptyl, 2,2,4-trimethylpentyl, n-octyl, isooctyl, n-nonyl, n-decyl, and n-dodecyl. In particular, methyl is preferred.

Examples of the cycloalkyl group represented by $R^{1b}$ include cyclopentyl, cyclohexyl, cycloheptyl, and methylcyclohexyl.

Examples of the aryl group represented by $R^{1b}$ include phenyl, tolyl, xylyl, ethylphenyl, and naphthyl. In particular, phenyl is preferred.

Examples of the aralkyl group represented by $R^{1b}$ include benzyl, α-phenylethyl, and β-phenylethyl.

In particular, $R^{1b}$ is preferably a C1-C18 alkyl group or an aryl group, more preferably methyl or phenyl, still more preferably methyl.

In the formula (1-3), m is an integer of 1 to 50, preferably an integer of 2 to 45. In the formula (1-4), n is an integer of 1 to 1500, preferably an integer of 2 to 1400.

Here, when m and/or n represents 2 or more, $R^{1b}$'s in repeating units are the same as or different from one another.

A's in the formulas (1-1) to (1-3) each independently represent a C1-C18 alkyl group, a cycloalkyl group, an aryl group, an aralkyl group, or a group represented by the formula (2), provided that at least one of A's in the formulas (1-1) to (1-3) is a group represented by the formula (2).

The C1-C18 alkyl group, the cycloalkyl group, the aryl group, and the aralkyl group represented by A are the same as those listed above for $R^{1a}$ and $R^{1b}$.

If the adhesion-imparting agent according to the present invention is free from the structural unit represented by the formula (1-3), all A's in the formulas (1-1) and (1-2) preferably represent a group represented by the formula (2) for favorable effects of improving adhesion.

$R^{2a}$ in the formula (2) represents a C1-C8 alkylene group in which a carbon atom other than a carbon atom bonded to a silicon atom is optionally partially substituted with an oxygen atom.

Examples of the C1-C8 alkylene group represented by $R^{2a}$ include methylene, ethylene, n-propylene, n-butylene, n-pentylene, n-hexylene, n-octylene, and a group obtained by substituting a carbon atom of each alkylene with an oxygen atom. In particular, ethylene, n-propylene, n-butylene, n-pentylene, n-hexylene, and a group obtained by substituting a carbon atom of each alkylene group with an oxygen atom are preferred.

$R^{2b}$'s in the formula (2) each independently represent a C1-C3 alkylene group.

Examples of the C1-C3 alkylene group represented by $R^{2b}$ include methylene, ethylene, n-propylene, and isopropylene.

When x in the formula (2) is 1 or more, $R^{2b}$'s may be the same as or different from one another.

$R^3$'s in the formula (2) each independently represent a C1-C3 alkylene group.

Examples of the C1-C3 alkylene group represented by $R^3$ include methylene, ethylene, n-propylene, and isopropylene.

When x in the formula (2) is 1 or more, $R^3$'s are the same as or different from one another.

$R^4$'s in the formula (2) each independently represent a hydrogen atom, a C1-C3 alkyl group, an OH group-containing C1-C3 alkyl group, or a halogeno group.

Examples of the C1-C3 alkyl group represented by $R^4$ include methyl, ethyl, n-propyl, and isopropyl.

Examples of the OH group-containing C1-C3 alkyl group represented by $R^4$ include hydroxymethyl and hydroxyethyl.

When x in the formula (2) is 1 or more, $R^4$'s are the same as or different from one another.

In the formula (2), x is an integer of 0 to 2, preferably an integer of 0 or 1.

The case in which x is 0 means the case in which $R^{2a}$ is directly bonded to a NH group.

In particular, the adhesion-imparting agent according to the present invention is preferably one in which, in the formula (2), $R^3$ represents methylene and $R^4$'s each independently represent a hydrogen atom or hydroxymethyl in terms of compatibility with the addition-curable silicone resin mixture or material availability.

The functional group of the adhesion-imparting agent according to the present invention is a carbamate (NHCOO) group in the formula (2). Specifically, the functional group equivalent of the adhesion-imparting agent is defined as (molecular weight of adhesion-imparting agent)/(number of moles of carbamate group), and depends on the numbers of m and n.

The lower limit of the functional group equivalent in the formula (2) of the adhesion-imparting agent according to the present invention is preferably 2,000, and the upper limit thereof is preferably 15,000. If the functional group equivalent in the formula (2) of the adhesion-imparting agent according to the present invention is less than 2,000, adhesion appropriate for the functional group equivalent in the group represented by the formula (2) may not be obtained or compatibility with the addition-curable silicone resin mixture may decrease. If the functional group equivalent in the formula (2) of the adhesion-imparting agent according to the present invention is more than 15,000, the addition-curable silicone resin composition with insufficient adhesion properties may be obtained. The lower limit of the functional group equivalent in the formula (2) of the adhesion-imparting agent according to the present invention is more preferably 3,000, still more preferably 4,000, and the upper limit thereof is more preferably 12,000, still more preferably 10,000.

The refractive index of the adhesion-imparting agent according to the present invention is in the range of 1.35 to 1.45. The adhesion-imparting agent according to the present invention with a refractive index in this range provides a highly transparent cured product from the addition-curable silicone resin composition. The lower limit of the refractive index of the adhesion-imparting agent according to the present invention is preferably 1.38, more preferably 1.40, and the upper limit thereof is preferably 1.44.

The term "refractive index" herein means a value determined using a digital Abbe refractometer (produced by ATAGO CO., LTD.) under the conditions of 25° C. and a wavelength of 589 nm.

The adhesion-imparting agent according to the present invention is produced, for example, by a method of reacting a silicone compound having a structural unit represented by the formula (3-3) and/or a structural unit represented by the formula (3-4) between a structural unit represented by the formula (3-1) and a structural unit represented by the formula (3-2) (hereinafter, also referred to as "amino group-containing silicone compound") with a cyclic carbonate compound represented by the formula (4) (hereinafter, also referred to as "cyclic carbonate compound").

(3-1)

(3-2)

(3-3)

-continued (3-4)

$R^{1a}$'s in the formulas (3-1) and (3-2) each independently represent a C1-C18 alkyl group, a cycloalkyl group, an aryl group, or an aralkyl group. $R^{1b}$'s in the formulas (3-3) and (3-4) each independently represent a C1-C18 alkyl group, a cycloalkyl group, an aryl group, or an aralkyl group. In the formula (3-3), m is an integer of 1 to 50, and in the formula (3-4), n is an integer of 1 to 1500. B's in the formulas (3-1) to (3-3) each independently represent a C1-C18 alkyl group, a cycloalkyl group, an aryl group, an aralkyl group, or a group represented by the formula (5), provided that at least one of B's in the formulas (3-1) to (3-3) is a group represented by the formula (5).

$R^{1a}$'s in the formulas (3-1) and (3-2) are the same as $R^{1a}$'s in the formulas (1-1) and (1-2), respectively. $R^{1b}$'s in the formulas (3-3) and (3-4) are the same as $R^{1b}$'s in the formulas (1-3) and (1-4), respectively.

(4)

In the formula (4), $R^3$ represents a C1-C3 alkylene group, and $R^4$ represents a hydrogen atom, a C1-C3 alkyl group, an OH group-containing C1-C3 alkyl group, or a halogeno group.

$R^3$ in the formula (4) is the same as $R^3$ in the formula (2). $R^4$ in the formula (4) is the same as $R^4$ in the formula (2).

(5)

$R^{2a}$ in the formula (5) represents a C1-C8 alkylene group in which a carbon atom other than a carbon atom bonded to a silicon atom is optionally partially substituted with an oxygen atom, and $R^{2b}$'s each independently represent a C1-C3 alkylene group. In the formula (5), x is an integer of 0 to 2.

$R^{2a}$ in the formula (5) is the same as $R^{2a}$ in the formula (2), and $R^{2b}$'s in the formula (5) are the same as $R^{2b}$'s in the formula (2).

When x in the formula (5) is 2, $R^{2b}$'s may be the same as or different from one another.

The amino group equivalent of the amino group-containing silicone compound corresponds to the above functional group equivalent of the adhesion-imparting agent according to the present invention. The functional group of the adhesion-imparting agent according to the present invention is a carbamate group (NHCOO).

The amino group equivalent of the amino group-containing silicone compound may be determined by, for example, non-aqueous neutralization titration using perchloric acid.

The number of moles of a carbamate group (NHCOO), which is a functional group contained in the adhesion-imparting agent according to the present invention, i.e., the functional group equivalent, can be calculated from the amino group equivalent of the amino group-containing silicone compound.

The amino group-containing silicone compound can be synthesized by a method involving a polycondensation reaction leading to incorporation of an alkyl amino group-containing dialkoxyalkyl silane unit into a siloxane chain, as disclosed in U.S. Pat. No. 3,355,424, U.S. Pat. No. 2,947,771, and U.S. Pat. No. 3,890,269. This reaction is usually carried out in the presence of an acid or alkali catalyst. This reaction can be performed as a polymerization reaction using a dialkoxyalkylsilane and a cyclic siloxane.

Examples of commercially available amino group-containing silicone compounds include KF-864, KF-865, KF-868 (monoamine type); KF-859, KF-393, KF-860, KF-880, KF-8004, KF-8002, KF-8005, KF-867, KF-869, KF-861 (diamine type); X-22-1660B-3, X-22-9409 (both ends amine type, side chain phenyl type), PAM-E, KF-8010, X-22-161A, X-22-161B, KF-8012, KF-8008 (both ends amine type) (all produced by Shin-Etsu Chemical Co., Ltd.); and BY16-205, BY16-849, FZ-3785, BY16-872, BY16-213, FZ-3705 (all produced by Dow Corning Toray Co., Ltd.).

Examples of the cyclic carbonate compound represented by the formula (4) include the compound represented by the formula (6). In particular, in terms of easiness of the reaction or the performance, a cyclic carbonate compound in which $R^3$ in the formula (4) is methylene is preferred, and ethylene carbonate and glycerol carbonate are more preferred.

(6)

The amount of the cyclic carbonate compound used in the reaction of the amino group-containing silicone compound with the cyclic carbonate compound is preferably 0.5 to 10 mol, more preferably 0.8 to 5 mol, per mole of the amino group of the amino group-containing silicone compound.

The amino group herein is reactive with the cyclic carbonate compound, and is specifically a primary amino group or secondary amino group.

Reaction of the amino group-containing silicone compound with the cyclic carbonate compound may be carried out in the presence of a solvent. A solvent to be used is preferably an appropriately polar solvent easily dissolving the amino group-containing silicone compound. Examples of the solvent include benzene, toluene, xylene, chlorobenzene, dichlorobenzene, cyclohexane, dichloromethane, chloroform, diethyl ether, diisopropyl ether, acetone, ethyl methyl ketone, methyl isobutyl ketone, isopropanol, and butanol.

Reaction of the amino group-containing silicone compound with the cyclic carbonate compound is carried out preferably at a temperature in the range of 40° C. to 180° C. depending on the solvent to be used, more preferably at a temperature in the range of 80° C. to 160° C. without using a solvent.

The lower limit of the amount of the adhesion-imparting agent according to the present invention in the addition-curable silicone resin composition of the present invention is preferably 0.01% by mass, and the upper limit thereof is preferably 15% by mass. The adhesion-imparting agent according to the present invention in an amount of less than 0.01% by mass may not sufficiently improve the adhesion. The adhesion-imparting agent according to the present invention in an amount of more than 15% by mass may adversely affect the hardness of the cured product. The lower limit of the amount of the adhesion-imparting agent according to the present invention is more preferably 0.1% by mass, still more preferably 0.3% by mass, and the upper limit thereof is more preferably 10% by mass, still more preferably 5% by mass.

In addition to the adhesion-imparting agent according to the present invention, the addition-curable silicone resin composition of the present invention may contain any other adhesion-imparting agent as long as the object of the present invention is not inhibited.

The addition-curable silicone resin composition of the present invention contains an addition-curable silicone resin mixture.

The addition-curable silicone resin mixture contains an addition-curable silicone resin which is curable by a hydrosilylation reaction of a carbon-carbon double bond-containing silyl group with a hydrosilyl group.

The addition-curable silicone resin mixture preferably includes a polyorganosiloxane having at least two substituents each containing a carbon-carbon double bond that is bonded to a silicon atom (hereinafter, also referred to as "carbon-carbon double bond-containing polyorganosiloxane"), a polyorganohydrogensiloxane having at least two hydrogen atoms each bonded to a silicon atom (hereinafter, also referred to as "polyorganohydrogensiloxane"), and a hydrosilylation reaction catalyst.

The molecular structure of the carbon-carbon double bond-containing polyorganosiloxane may be, for example, linear or cyclic, and the structure may be branched. In particular, preferred is a linear structure in which the main chain includes diorganosiloxane repeating units and is capped at both ends with triorganosiloxy groups.

Each substituent containing a carbon-carbon double bond that is bonded to a silicon atom, of the carbon-carbon double bond-containing polyorganosiloxane, preferably has 2 to 8 carbon atoms. Specific examples of the substituent include vinyl, allyl, butenyl, pentenyl, hexenyl, heptenyl, acryloyl, and methacryloyl. In particular, vinyl, acryloyl and methacryloyl are preferred, and vinyl is more preferred.

When the molecular structure of the carbon-carbon double bond-containing polyorganosiloxane is linear, the substituents containing a carbon-carbon double bond each may be bonded to a silicon atom either as an end group or a side chain of the polyorganosiloxane or both as an end group and a side chain thereof.

Examples of the organic group bonded to a silicon atom other than the substituents containing a carbon-carbon double bond, of the carbon-carbon double bond-containing polyorganosiloxane, include an unsubstituted or halogen-substituted monovalent hydrocarbon group such as a C1-C10 alkyl group (e.g. methyl, ethyl, n-propyl, n-butyl, n-pentyl, n-hexyl, n-heptyl); a C6-C14 aryl group (e.g. phenyl, tolyl, xylyl, naphthyl); an aralkyl group (e.g. benzyl, phenethyl); and a halogenated alkyl group (e.g. chloromethyl, 3-chloropropyl, 3,3,3-trifluoropropyl). In particular, an alkyl group and an aryl group are preferred, methyl and phenyl are more preferred, and methyl is still more preferred.

The lower limit of the viscosity of the carbon-carbon double bond-containing polyorganosiloxane is preferably 100 mPa·s, and the upper limit thereof is preferably 100,000 mPa·s. The carbon-carbon double bond-containing polyorganosiloxane having a viscosity within this range can provide an addition-curable silicone resin composition with good workability and a cured product with good physical characteristics from the addition-curable silicone resin composition. The lower limit of the viscosity of the carbon-carbon double bond-containing polyorganosiloxane is more preferably 500 mPa·s, and the upper limit thereof is more preferably 10,000 mPa·s.

The "viscosity" herein means a value determined using a rotational viscometer (BM type) at 25° C.

Specific examples of the carbon-carbon double bond-containing polyorganosiloxane include a dimethylsiloxane/methylvinylsiloxane copolymer capped at both ends with trimethylsiloxy groups, methylvinylpolysiloxane capped at both ends with trimethylsiloxy groups, dimethylpolysiloxane capped at both ends with dimethylvinylsiloxy groups, methylvinylpolysiloxane capped at both ends with dimethylvinylsiloxy groups, a dimethylsiloxane/methylvinylsiloxane copolymer capped at both ends with dimethylvinylsiloxy groups, dimethylpolysiloxane capped at both ends with trivinylsiloxy groups, a polyorganosiloxane copolymer including a siloxy unit represented by $(R^5)_3SiO_{0.5}$ ($R^5$ is an unsubstituted or substituted monovalent hydrocarbon group other than an alkenyl group, the same shall apply hereinafter), a siloxy unit represented by $(R^5)_2R^6SiO_{0.5}$ ($R^6$ is an alkenyl group, the same shall apply hereinafter), and a siloxy unit represented by $SiO_2$; a polyorganosiloxane copolymer including a siloxy unit represented by $(R^5)_2R^6SiO_{0.5}$, a siloxy unit represented by $(R^5)_2SiO$, and a siloxy unit represented by $SiO_2$; and a polyorganosiloxane copolymer including a siloxy unit represented by $R^5R^6SiO$ and a siloxy unit represented by $R^5SiO_{1.5}$ or a siloxy unit represented by $R^6SiO_{1.5}$. Each of these may be used alone, or two or more of these may be used in combination.

Examples of $R^5$ include a C1-C10 alkyl group such as methyl, ethyl, n-propyl, n-butyl, n-pentyl, n-hexyl, and n-heptyl; a C6-C14 aryl group such as phenyl, tolyl, xylyl, and naphthyl; an aralkyl group such as benzyl and phenethyl; and a halogenated alkyl group such as chloromethyl, 3-chloropropyl, and 3,3,3-trifluoropropyl. In particular, $R^5$ is preferably an alkyl group or an aryl group, more preferably methyl or phenyl, still more preferably methyl.

$R^6$ preferably has 2 to 8 carbon atoms, and examples thereof include vinyl, allyl, butenyl, pentenyl, hexenyl, heptenyl, acryloyl, and methacryloyl. In particular, $R^6$ is preferably vinyl, acryloyl, or methacryloyl, more preferably vinyl.

The polyorganohydrogensiloxane is reactive with the carbon-carbon double bond-containing polyorganosiloxane and acts as a cross-linking component.

As the polyorganohydrogensiloxane, various polyorganohydrogensiloxanes having, for example, a linear, cyclic, branched, or three-dimensional network (resinous) molecular structure can be used.

The polyorganohydrogensiloxane contains in one molecule two or preferably three or more hydrogen atoms each bonded to a silicon atom, that is, the polyorganohydrogensiloxane contains hydrosilyl groups (Si—H groups). When the polyorganohydrogensiloxane has a linear molecular structure, these Si—H groups each may be located either at an end or an intermediate of the polyorganohydrogensiloxane or both at an end and an intermediate thereof.

The number of silicon atoms (degree of polymerization) in one molecule of the polyorganohydrogensiloxane is preferably 2 to 1,000, more preferably 3 to 100.

The polyorganohydrogensiloxane to be used is represented by $R^7_a H_b SiO_{(4-a-b/2)}$ in which $R^7$ is an unsubstituted or substituted C1-C14 monovalent hydrocarbon group other than an aliphatic unsaturated group; $R^7$ preferably contains 1 to 10 carbon atoms; a and b are positive numbers preferably satisfying $0.7 \leq a \leq 2.1$, $0.001 \leq b \leq 1.0$, and $0.8 \leq a+b \leq 3.0$, a+b more preferably satisfying $1.0 \leq a+b \leq 2.5$.

Examples of $R^7$ include an alkyl group such as methyl, ethyl, n-propyl, isopropyl, n-butyl, isobutyl, t-butyl, n-pentyl, neopentyl, n-hexyl, cyclohexyl, n-octyl, nonyl, n-decyl; an aryl group such as phenyl, tolyl, xylyl, and naphthyl; an aralkyl group such as benzyl, phenylethyl, and phenylpropyl, and a group obtained by substituting part or all of the hydrogen atoms of each hydrocarbon group with a halogen atom, e.g. chloromethyl, 3-chloropropyl, bromoethyl, and 3,3,3-trifluoropropyl. In particular, $R^7$ is preferably an alkyl group or an aryl group, more preferably methyl or phenyl, still more preferably methyl.

Specific examples of the polyorganohydrogensiloxane include methylhydrogenpolysiloxane capped at both ends with trimethylsiloxy groups, a dimethylsiloxane/methylhydrogensiloxane copolymer capped at both ends with trimethylsiloxy groups, dimethylpolysiloxane capped at both ends with dimethylhydrogensiloxy groups, a dimethylpolysiloxane/methylhydrogensiloxane copolymer capped at both ends with dimethylhydrogensiloxy groups, a polyorganosiloxane copolymer including a siloxy unit represented by $(R^5)_3SiO_{0.5}$ ($R^5$ is as listed above), a siloxy unit represented by $(R^5)_2HSiO_{0.5}$, and a siloxy unit represented by $SiO_2$; a polyorganosiloxane copolymer including a siloxy unit represented by $(R^5)_2HSiO_{0.5}$ and a siloxy unit represented by $SiO_2$; and a polyorganosiloxane copolymer including a siloxy unit represented by $R^5HSiO$ and a siloxy unit represented by $R^5SiO_{1.5}$ or a siloxy unit represented by $HSiO_{1.5}$. Each of these may be used alone, or two or more of these may be used in combination.

The polyorganohydrogensiloxane is contained in an amount effective to cure the carbon-carbon double bond-containing polyorganosiloxane, in particular, preferably in an amount such that the number of Si—H groups of the polyorganohydrogensiloxane is 0.1 to 4.0 per substituent containing a carbon-carbon double bond of the carbon-carbon double bond-containing polyorganosiloxane. If the number of Si—H groups is less than 0.1 per substituent containing a carbon-carbon double bond, the curing reaction may not proceed and the cured product may hardly be produced. If the number of Si—H groups is more than 4.0 per substituent containing a carbon-carbon double bond, a large amount of unreacted Si—H groups remains in the cured product, which may cause a change over time in the properties of the cured product. The number of Si—H groups is more preferably 1.0 to 3.0 per substituent containing a carbon-carbon double bond.

The hydrosilylation reaction catalyst may be conventionally known one. Specific examples thereof include platinum group metal catalysts such as platinum group metal elements (e.g. platinum (including platinum black), rhodium, palladium); platinum chloride, chloroplatinic acid, and chloroplatinate (e.g. $H_2PtCl_4 \cdot yH_2O$, $H_2PtCl_6 \cdot yH_2O$, $NaHPtCl_6 \cdot yH_2O$, $KHPtClG \cdot yH_2O$, $Na_2PtCl_6 \cdot yH_2O$, $K_2PtCl_4 \cdot yH_2O$, $PtCl_4 \cdot yH_2O$, $PtCl_2$, $Na_2HPtCl_4 \cdot yH_2O$ in which y is an integer of 0 to 6, preferably an integer of 0 or 6); alcohol modified chloroplatinic acid (U.S. Pat. No. 3,220,972); a complex of chloroplatinic acid and an olefin (U.S. Pat. No. 3,159,601, U.S. Pat. No. 3,159,662, U.S. Pat. No. 3,775,452); a platinum group metal such as platinum black or palladium supported on a carrier such as alumina, silica, or carbon; a rhodium-olefin complex; chlorotris (triphenylphosphine)rhodium (Wilkinson catalyst); a complex of a vinyl group-containing siloxane and platinum chloride, chloroplatinic acid, or chloroplatinate; dichloro dipyridine platinum (II) (JP H09-165453 A); and a platinum-vinylsiloxane complex (JP H11-152337 A) (e.g. $Pt_2\{[(CH_2=CH)Me_2Si]_2O\}_3$, $HPt_2\{[(CH_2CH)Me_2Si_2]O\}_2$, $PtCO(CH_2=CH(Me)SiO)_4$, $Pt(CH_2=CH(Me)SiO)_4$).

The amount of the hydrosilylation reaction catalyst in the addition-curable silicone resin mixture may be any amount that is effective to catalyze the hydrosilylation reaction, preferably, in such an amount that the addition-curable silicone resin mixture contains 0.1 to 1,000 ppm of a metal element such as platinum. The hydrosilylation reaction catalyst in such an amount sufficiently accelerates the addition reaction, thereby providing a sufficiently cured addition-curable silicone resin composition and achieving economic advantage. The amount of the hydrosilylation reaction catalyst is more preferably 1 to 500 ppm, still more preferably 1 to 20 ppm.

The refractive index of the addition-curable silicone resin mixture is in the range of 1.35 to 1.45. When the addition-curable silicone resin mixture has a refractive index within this range, the resulting addition-curable silicone resin composition provides a highly transparent cured product. The lower limit of the refractive index of the addition-curable silicone resin mixture is preferably 1.38, more preferably 1.40. The upper limit thereof is preferably 1.44.

The addition-curable silicone resin mixture may be a commonly known one, preferably of two-component thermosetting type for its easy availability.

Examples of commercially available two-component thermosetting addition-curable silicone resin mixtures include IVS4312, XE14-C2042, IVS4542, IVS4546, IVS4622, IVS4632, IVS4742, and IVS4752 (all produced by Momentive Performance Materials Inc.), KER-2500, KER-2500N, KER-2600, KER-2700, KER-6150, KER-6075F, and KER-6020F (all produced by Shin-Etsu Chemical Co., Ltd.), OE-6351, OE-6336, OE-6370M, EG-6301, JCR-6125, and JCR-6140 (all produced by Dow Corning Toray Co., Ltd.).

The addition-curable silicone resin composition of the present invention may optionally contain an additive in addition to the addition-curable silicone resin mixture and the adhesion-imparting agent according to the present invention, as long as the object and the effects of the present invention are not impaired.

Examples of the additive include inorganic fillers, antioxidants, inorganic phosphors, lubricants, ultraviolet absorbers, heat and light stabilizers, dispersants, antistatic agents, polymerization inhibitors, antifoamers, curing accelerators, solvents, anti-aging agents, radical inhibitors, adhesion improvers, flame retardants, surfactants, storage stability improvers, antiozonants, thickeners, plasticizers, radiation shielding agents, nucleating agents, coupling agents, conductivity-imparting agents, phosphorus peroxide decomposers, pigments, metal deactivators, and physical property modifiers.

The inorganic fillers may be, but is not limited to, fine-particle fillers which do not deteriorate optical properties. Examples thereof include alumina, aluminum hydroxide, fused silica, crystalline silica, ultrafine amorphous silica, hydrophobic ultrafine silica, talc, calcium carbonate, and barium sulfate.

Examples of the inorganic phosphors include yttrium aluminum garnet (YAG) phosphors, ZnS phosphors, $Y_2O_2S$ phosphors, red emission phosphors, blue emission phosphors, green emission phosphors, which are widely used in LEDs.

The addition-curable silicone resin composition of the present invention can be produced, for example, by mixing the addition-curable silicone resin mixture, the adhesion-imparting agent according to the present invention, and optionally an additive.

The addition-curable silicone resin composition of the present invention may be of one-component or two-component type.

The addition-curable silicone resin composition of the present invention can be used, for example, by applying to a base material such as an optical semiconductor device and curing.

The addition-curable silicone resin composition of the present invention is applied to a base material by, for example, a method using a dispenser, potting, screen printing, transfer molding, or injection molding.

The addition-curable silicone resin composition of the present invention can be cured at room temperature or by heating. Another aspect of the present invention relates to an addition-curable silicone resin cured product prepared by curing the addition-curable silicone resin composition of the present invention.

The final heating temperature for curing the addition-curable silicone resin composition of the present invention is usually 100° C. or higher, preferably 120° C. or higher, more preferably 120° C. to 200° C., still more preferably 120° C. to 180° C.

The addition-curable silicone resin composition of the present invention is used for, for example, a sealant composition for electronic materials, a building sealant composition, a vehicle sealant composition, and an adhesive composition.

Examples of the electronic materials include supporting members such as a lead frame, a wired tape carrier, a wiring board, glass, and silicon wafer; an optical semiconductor device; active elements such as a semiconductor chip, a transistor, a diode, and a thyristor; passive elements such as capacitor, a resistor, and a coil. In particular, the composition can be preferably used for a sealant for an optical semiconductor device.

Another aspect of the present invention relates to a sealed optical semiconductor element in which an optical semiconductor device is sealed with the addition-curable silicone resin cured product of the present invention.

The addition-curable silicone resin composition of the present invention is also used for, for example, materials for displays, for optical recording media, for optical equipment, for optical parts, and for optical fibers; optical-electronic functional organic materials; and peripheral materials of semiconductor integrated circuits.

Advantageous Effects of Invention

The present invention can provide an addition-curable silicone resin composition with excellent interfacial adhesion properties, storage stability, and transparency. The present invention can also provide an addition-curable silicone resin cured product formed from the addition-curable silicone resin composition and a sealed optical semiconductor element formed by using the addition-curable silicone resin composition.

DESCRIPTION OF EMBODIMENTS

The present invention is explained in more detail below based on examples, but is not limited to these examples.

Production Example 1

Reaction of Amino Group-Containing Silicone Compound with Ethylene Carbonate (Preparation of Adhesion-Imparting Agent A)

A 50-mL four-necked flask equipped with a magnetic stir bar, a thermometer, and a condenser was charged under a nitrogen atmosphere with 10.0 g (amino group 2.00 mmol) of an amino group-containing silicone compound ("KF-865" produced by Shin-Etsu Chemical Co., Ltd., amino group equivalent 5,000 g/mol) and 0.35 g (4.00 mmol) of ethylene carbonate (molecular weight 88.06). The contents were heated to 120° C. and stirred using a magnetic stirrer for 15 hours. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 9.3 g of a transparent liquid (adhesion-imparting agent A).

Measurement of the adhesion-imparting agent A by $^1$H-NMR confirmed that the adhesion-imparting agent A included a structural unit represented by the formula (1-1) ($R^{1a}$ is methyl, A is methyl), a structural unit represented by the formula (1-2) ($R^{1a}$ is methyl, A is methyl), a structural unit represented by the formula (1-3) ($R^{1b}$ is methyl, A is a group represented by the formula (2), $R^{2a}$ is n-propylene, x is 0, $R^3$ is methylene, $R^4$ is hydrogen), and a structural unit represented by the formula (1-4) ($R^{1b}$ is methyl).

The refractive index of the adhesion-imparting agent A was measured to be 1.407 using a digital Abbe refractometer (produced by ATAGO CO., LTD.) under the conditions of 25° C. and a wavelength of 589 nm.

Production Example 2

Reaction of Amino Group-Containing Silicone Compound with Glycerol Carbonate (Preparation of Adhesion-Imparting Agent B)

A 50-mL four-necked flask equipped with a magnetic stir bar, a thermometer, and a condenser was charged under a nitrogen atmosphere with 10.0 g (amino group 2.00 mmol) of an amino group-containing silicone compound ("KF-865" produced by Shin-Etsu Chemical Co., Ltd., amino group equivalent 5,000 g/mol) and 0.47 g (3.95 mmol) of glycerol carbonate (molecular weight 118.09). The contents were heated to 120° C. and stirred using a magnetic stirrer for 15 hours. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 9.3 g of a transparent liquid (adhesion-imparting agent B).

Measurement of the adhesion-imparting agent B by $^1$H-NMR confirmed that the adhesion-imparting agent B included a structural unit represented by the formula (1-1) ($R^{1a}$ is methyl, A is methyl), a structural unit represented by the formula (1-2) ($R^{1a}$ is methyl, A is methyl), a structural unit represented by the formula (1-3) ($R^{1b}$ is methyl, A is a group represented by the formula (2), $R^{2a}$ is n-propylene, x is 0, $R^3$ is methylene, $R^4$ is hydroxymethyl), and a structural unit represented by the formula (1-4) ($R^{1b}$ is methyl).

The refractive index of the adhesion-imparting agent B was measured to be 1.407 in the same manner as that for the adhesion-imparting agent A.

Production Example 3

Reaction of Silicone Compound Containing Phenyl and Amino Groups with Ethylene Carbonate (Preparation of Adhesion-Imparting Agent E)

A 50-mL four-necked flask equipped with a magnetic stir bar, a thermometer, and a condenser was charged under a nitrogen atmosphere with 5.0 g (amino group 2.27 mmol) of a silicone compound containing phenyl and amino groups ("X-22-1660B-3" produced by Shin-Etsu Chemical Co., Ltd., amino group equivalent 2,200 g/mol) and 1.0 g (11.4 mmol) of ethylene carbonate (molecular weight 88.06). The contents were heated to 120° C. and stirred for 15 hours using a magnetic stirrer. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 4.1 g of a transparent liquid (adhesion-imparting agent E).

Measurement of the adhesion-imparting agent E by $^1$H-NMR confirmed that the adhesion-imparting agent E included a structural unit represented by the formula (1-1) ($R^{1a}$ is methyl, A is a group represented by the formula (2), $R^{2a}$ is n-propylene, x is 0, $R^3$ is methylene, $R^4$ is hydrogen), a structural unit represented by the formula (1-2) ($R^{1a}$ is methyl, A is a group represented by the formula (2), $R^{2a}$ is n-propylene, x is 0, $R^3$ is methylene, $R^4$ is hydrogen), and a structural unit represented by the formula (1-4) ($R^{1b}$ is methyl or phenyl). The refractive index of the adhesion-imparting agent E was measured to be 1.502 using a digital Abbe refractometer (produced by ATAGO CO., LTD.) under the conditions of 25° C. and a wavelength of 589 nm.

Examples 1 to 7, Comparative Examples 1 to 5

Ingredients in the amounts shown in Table 1 were uniformly mixed, and deaeration was sufficiently performed to prepare addition-curable silicone resin compositions.

As the addition-curable silicone resin mixture A-1 in Table 1, a 1:1 mixture of a type A liquid and a type B liquid of OE-6370M (produced by Dow Corning Toray Co., Ltd.) was used. OE-6370M was an addition-curable silicone resin mixture with a refractive index of 1.409. The addition-curable silicone resin mixture A-1 contained a carbon-carbon double bond-containing polyorganosiloxane component and a polyorganohydrogensiloxane component.

As the addition-curable silicone resin mixture B-1 in Table 1, a 1:1 mixture of a type A liquid and a type B liquid of KER-6150 (produced by Shin-Etsu Chemical Co., Ltd.) was used. KER-6150 was an addition-curable silicone resin mixture with a refractive index of 1.441. The addition-curable silicone resin mixture B-1 contained a carbon-carbon double bond-containing polyorganosiloxane component and a polyorganohydrogensiloxane component.

As the adhesion-imparting agent C in Table 1, glycidoxypropyltrimethoxysilane ("Z-6040" produced by Dow Corning Toray Co., Ltd., refractive index 1.427) was used, and as the adhesion-imparting agent D, triglycidyl isocyanurate (produced by Tokyo Chemical Industry Co., Ltd., refractive index was not measurable due to its solid state) was used.

<Evaluation>

The addition-curable silicone resin compositions obtained in Examples 1 to 7 and Comparative Examples 1 to 5 were evaluated as follows. Table 1 shows the results.

(1) Hardness (Type A)

Each of the addition-curable silicone resin compositions obtained in Examples 1 to 7 and Comparative Examples 1 to 5 was poured into a resin mold, and cured by heating at 150° C. for two hours, followed by heating at 170° C. for two hours. The resulting cured product was released from the mold, and formed into a test piece for hardness measurement with a radius of 20 mm and a thickness of 6 mm. The resulting test piece for hardness measurement was measured for hardness (Type A) using a hardness tester for rubber and plastics ("KR-24A" produced by KORI SEIKI MFG. CO., LTD.).

(2) Tensile-Shear Adhesion Strength and Interfacial Adhesion to PCT

Each of the addition-curable silicone resin compositions obtained in Examples 1 to 7 and Comparative Examples 1 to 5 was poured between two PCT plates ("PROVEST C101LW" produced by Mitsui Chemicals, Inc., size 2×25×100 mm) so that the composition had a thickness of 2 mm and the plates were bonded at a 20×25 mm rectangular area. The composition was cured by heating at 150° C. for two hours, followed by heating at 170° C. for two hours. Thus, a test piece for a tensile-shear test was prepared. The PCT plates used as base materials for adhesion were dried at 150° C. for one hour before use. The obtained test piece was subjected to a tensile-shear adhesion test using a tensile tester ("AGS-X" produced by SHIMADZU CORPORATION) under the conditions of a distance between the clamps of 100 mm and a test speed of 5 mm/min. Thus, the tensile-shear adhesion strength was determined.

The cross section was visually observed after the tensile-shear adhesion test to evaluate the interfacial adhesion. The failure patterns as shown in FIGS. 1A and 1B were represented by AF and the failure pattern as shown in FIG. 1C was represented by CF.

(3) Tensile-Shear Adhesion Strength and Interfacial Adhesion to Silver-Plated Copper Plate Each of the addition-curable silicone resin compositions obtained in Examples 1 to 7 and Comparative Examples 1 to 5 was poured between two silver-plated copper plates (size 2×25×100 mm) so that the composition had a thickness of 2 mm and the plates were bonded at a 20×25 mm rectangular area. The composition was cured by heating at 150° C. for two hours, followed by heating at 170° C. for two hours. Thus, a test piece for a tensile-shear test was prepared. The silver-plated copper plates used as base materials were dried at 150° C. for one hour before use. The test piece obtained was subjected to a tensile-shear adhesion test using a tensile tester ("AGS-X" produced by SHIMADZU CORPORATION) under the conditions of a distance between the clamps of 100 mm and a test speed of 5 mm/min. Thus, the tensile-shear adhesion strength was determined.

The cross section was visually observed after the tensile-shear adhesion test to evaluate the interfacial adhesion. The failure patterns as shown in FIGS. 1A and 1B were represented by AF and the failure pattern as shown in FIG. 1C was represented by CF.

(4) Total Light Transmittance

Each of the addition-curable silicone resin compositions obtained in Examples 1 to 7 and Comparative Examples 1 to 5 was poured on a PFA (tetrafluoroethylene-perfluoro (alkyl vinyl ether) copolymer) plate so that the composition had a thickness of 1 mm. The composition was cured by heating at 150° C. for two hours, followed by heating at 170° C. for two hours. Thus, a test piece for a total light transmittance test was prepared. The resulting test piece for a total light transmittance test was measured for total light transmittance using a haze meter ("NDH 2000" produced by NIPPON DENSHOKU INDUSTRIES CO., LTD.).

Examples 8 to 14, Comparative Examples 6 to 10

Ingredients in the amounts disclosed in Table 2 were uniformly mixed, and deaeration was sufficiently performed to prepare addition-curable silicone resin compositions.

As the addition-curable silicone resin mixture A-2 in Table 2, a type A liquid of OE-6370M (produced by Dow Corning Toray Co., Ltd.) was used. The silicone resin mixture A-2 contained a carbon-carbon double bond-containing polyorganosiloxane component.

As the addition-curable silicone resin mixture B-2 in Table 2, a type A liquid of KER-6150 (produced by Shin-Etsu Chemical Co., Ltd.) was used. The silicone resin mixture B-2 contained a carbon-carbon double bond-containing polyorganosiloxane component.

As the adhesion-imparting agent C in Table 2, glycidoxypropyltrimethoxysilane ("Z-6040" produced by Dow Corning Toray Co., Ltd., refractive index 1.427) was used, and as the adhesion-imparting agent D in Table 2, triglycidyl isocyanurate (produced by Tokyo Chemical Industry Co., Ltd., refractive index could not be measured due to its solid state) was used.

<Evaluation>

The addition-curable silicone resin compositions obtained in Examples 8 to 14 and Comparative Examples 6 to 10 were evaluated as follows. Table 2 shows the results.

(5) Storage Stability

Each of the addition-curable silicone resin compositions obtained in Examples 8 to 14 and Comparative Examples 6

TABLE 1

| | | | Example | | | | | | | Comparative Example | | | | |
|---|---|---|---|---|---|---|---|---|---|---|---|---|---|---|
| | | | 1 | 2 | 3 | 4 | 5 | 6 | 7 | 1 | 2 | 3 | 4 | 5 |
| Composition (part by mass) | Addition-curable silicone resin mixture A-1 ("OE-6370M" produced by Dow Corning Toray Co., Ltd. (refractive index 1.409)) | | 100 | 100 | 100 | 100 | 100 | 100 | — | 100 | 100 | 100 | — | — |
| | Addition-curable silicone resin mixture B-1 ("KER-6150" produced by Shin-Etsu Chemical Co., Ltd. (refractive index 1.441)) | | — | — | — | — | — | — | 100 | — | — | — | 100 | 100 |
| | Adhesion-imparting agent according to the present invention | Adhesion-imparting agent A (refractive index 1.407) | 0.5 | 1 | 3 | — | — | — | 1 | — | — | — | — | — |
| | | Adhesion-imparting agent B (refractive index 1.407) | — | — | — | 0.5 | 1 | 3 | — | — | — | — | — | — |
| | Other adhesion-imparting agents | Adhesion-imparting agent C (refractive index 1.427) | — | — | — | — | — | — | — | — | 1 | — | — | — |
| | | Adhesion-imparting agent D (no data of refractive index) | — | — | — | — | — | — | — | — | — | 1 | — | — |
| | | Adhesion-imparting agent E (refractive index 1.502) | — | — | — | — | — | — | — | — | — | — | — | 1 |
| Evaluation | Hardness (Type A) | | 71 | 71 | 71 | 71 | 71 | 71 | 50 | 71 | 71 | 71 | 50 | 50 |
| | Tensile-shear adhesion test for PCT | Tensile-shear adhesion strength (MPa) | 1.3 | 1.6 | 1.7 | 1.4 | 1.7 | 1.9 | 1.2 | 0.8 | 1.0 | 1.1 | 0.5 | 1.0 |
| | | Interface adhesion (failure pattern) | CF | CF | CF | CF | CF | CF | CF | AF | AF | AF | AF | CF |
| | Tensile-shear adhesion test for silver-plated copper plate | Tensile-shear adhesion strength (MPa) | 0.9 | 1.2 | 1.3 | 1.2 | 1.4 | 1.5 | 0.8 | 0.4 | 0.8 | 0.8 | 0.3 | 0.8 |
| | | Interface adhesion (failure pattern) | CF | CF | CF | CF | CF | CF | CF | AF | AF | AF | AF | CF |
| | Total light transmittance (%) | | 92 | 92 | 92 | 92 | 92 | 92 | 93 | 92 | 92 | 86 | 93 | 85 | to 10 was kept warm at 70° C. for 30 days, and the initial viscosity (23° C.) and transmittance (wavelength 400 nm) of the composition before being kept warm were compared to the viscosity (23° C.) and transmittance (wavelength 400 nm) of the composition after being kept warm, respectively. The storage stability was evaluated from the amounts of changes of the viscosity and transmittance. The viscosities were measured using a digital viscometer DVH-EII (produced by Tokimec, Inc.), and the transmittances were measured using a U-4100 type spectrophotometer (produced by Hitachi High-Technologies Corporation.).

an addition-curable silicone resin mixture; and
an adhesion-imparting agent,
the addition-curable silicone resin mixture having a refractive index of 1.35 to 1.45,
the adhesion-imparting agent including a compound that includes a structural unit represented by the formula (1-3) and/or a structural unit represented by the formula (1-4) between a structural unit represented by the formula (1-1) and a structural unit represented by the formula (1-2), the compound having a refractive index of 1.35 to 1.45:

TABLE 2

| | | | Example | | | | | | | Comparative Example | | | | |
|---|---|---|---|---|---|---|---|---|---|---|---|---|---|---|
| | | | 8 | 9 | 10 | 11 | 12 | 13 | 14 | 6 | 7 | 8 | 9 | 10 |
| Composition (part by mass) | Addition-curable silicone resin mixture A-2 ("OE-6370M" produced by Dow Corning Toray Co., Ltd.) | | 100 | 100 | 100 | 100 | 100 | 100 | — | 100 | 100 | 100 | — | — |
| | Addition-curable silicone resin mixture B-2 ("KER-6150" produced by Shin-Etsu Chemical Co., Ltd.) | | — | — | — | — | — | — | 100 | — | — | — | 100 | 100 |
| | Adhesion-imparting agent according to the present invention | Adhesion-imparting agent A (refractive index 1.407) | 0.5 | 1 | 3 | — | — | — | 1 | — | — | — | — | — |
| | | Adhesion-imparting agent B (refractive index 1.407) | — | — | — | 0.5 | 1 | 3 | — | — | — | — | — | — |
| | Other adhesion-imparting agents | Adhesion-imparting agent C (refractive index 1.427) | — | — | — | — | — | — | — | — | 1 | — | — | — |
| | | Adhesion-imparting agent D (no data of refractive index) | — | — | — | — | — | — | — | — | — | 1 | — | — |
| | | Adhesion-imparting agent E (refractive index 1.502) | — | — | — | — | — | — | — | — | — | — | — | — | 1 |
| Evaluation | Storage stability | Amount of change of viscosity (Pa · s) | Less than 0.1 | Less than 0.1 | Less than 0.1 | Less than 0.1 | Less than 0.1 | Less than 0.1 | Less than 0.1 | Less than 0.1 | 1.2 | Less than 0.1 | Less than 0.1 | Less than 0.1 |
| | | Amount of change of transmittance (%) | Less than 0.5 | Less than 0.5 | Less than 0.5 | Less than 0.5 | Less than 0.5 | Less than 0.5 | Less than 0.5 | Less than 0.5 | 2.2 | Less than 0.5 | Less than 0.5 | Less than 0.5 |

INDUSTRIAL APPLICABILITY

The present invention can provide an addition-curable silicone resin composition with excellent interfacial adhesion properties, storage stability, and transparency. Furthermore, the present invention can provide an addition-curable silicone resin cured product formed from the addition-curable silicone resin composition and a sealed optical semiconductor element formed by using the addition-curable silicone resin composition.

REFERENCE SIGNS LIST

1 Adherend
2 Addition-curable silicone resin cured product

The invention claimed is:
1. An addition-curable silicone resin composition comprising:

(1-1)

(1-2)

(1-3)

-continued (1-4)

wherein $R^{1a}$'s in the formulas (1-1) and (1-2) each independently represent a C1-C18 alkyl group, a cycloalkyl group, an aryl group, or an aralkyl group; $R^{1b}$'s in the formulas (1-3) and (1-4) each independently represent a C1-C18 alkyl group, a cycloalkyl group, an aryl group, or an aralkyl group; m in the formula (1-3) is an integer of 1 to 50; n in the formula (1-4) is an integer of 1 to 1500; and A's in the formulas (1-1) to (1-3) each independently represent a C1-C18 alkyl group, a cycloalkyl group, an aryl group, an aralkyl group, or a group represented by the formula (2), provided that at least one of A's in the formulas (1-1) to (1-3) is a group represented by the formula (2):

(2)

wherein $R^{2a}$ represents a C1-C8 alkylene group in which a carbon atom other than a carbon atom bonded to a silicon atom is optionally partially substituted with an oxygen atom; $R^{2b}$'s each independently represent a C1-C3 alkylene group; $R_3$'s each independently represent a C1-C3 alkylene group; $R^4$'s each independently represent a hydrogen atom, a C1-C3 alkyl group, an OH group-containing C1-C3 alkyl group, or a halogeno group; and x is an integer of 0 to 2.

2. The addition-curable silicone resin composition according to claim 1,
wherein, in the formula (2), $R^3$ represents methylene and $R^4$'s each independently represent a hydrogen atom or hydroxymethyl.

3. The addition-curable silicone resin composition according to claim 1,
wherein the adhesion-imparting agent is contained in an amount of 0.01% to 15% by mass.

4. The addition-curable silicone resin composition according to claim 1,
wherein the addition-curable silicone resin mixture comprises a polyorganosiloxane having at least two substituents each containing a carbon-carbon double bond that is bonded to a silicon atom, a polyorganohydrogensiloxane having at least two hydrogen atoms each bonded to a silicon atom, and a hydrosilylation reaction catalyst.

5. The addition-curable silicone resin composition according to claim 1,
wherein the substituents each containing a carbon-carbon double bond that is bonded to a silicon atom, in the polyorganosiloxane, are vinyl.

6. An addition-curable silicone resin cured product prepared by curing the addition-curable silicone resin composition according to claim 1.

7. A sealed optical semiconductor element in which an optical semiconductor device is sealed with the addition-curable silicone resin cured product according to claim 6.

* * * * *

UNITED STATES PATENT AND TRADEMARK OFFICE
CERTIFICATE OF CORRECTION

PATENT NO. : 9,783,717 B2  
APPLICATION NO. : 14/911412  
DATED : October 10, 2017  
INVENTOR(S) : Fukuda

Page 1 of 1

It is certified that error appears in the above-identified patent and that said Letters Patent is hereby corrected as shown below:

In the Claims

Claim 1, Column 20, Line 4: Delete "index of 135" and insert --index of 1.35--.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*